US006421551B1

(12) United States Patent
Kuth et al.

(10) Patent No.: US 6,421,551 B1
(45) Date of Patent: Jul. 16, 2002

(54) METHOD FOR REGISTERING IMAGES OF A SUBJECT WITH A MAGNETIC RESONANCE SYSTEM AND MAGNETIC RESONANCE SYSTEM FOR THE IMPLEMENTATION OF THE METHOD

(75) Inventors: Rainer Kuth, Herzogenaurach; Arnulf Oppelt, Spardorf; Theodor Vetter, Erlangen, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/377,750

(22) Filed: Aug. 20, 1999

(30) Foreign Application Priority Data

Aug. 25, 1998 (DE) .......................................... 198 38 590

(51) Int. Cl.[7] .............................................. A61B 5/005
(52) U.S. Cl. ....................... 600/410; 600/414; 600/415; 600/426; 324/307; 324/309
(58) Field of Search ................................ 600/414, 415, 600/417, 411, 426, 427, 429; 324/307, 309

(56) References Cited

U.S. PATENT DOCUMENTS

| 4,923,459 A | 5/1990 | Nambu ........................ 606/130 |
| 5,218,964 A | 6/1993 | Sepponen .................. 128/653.2 |
| 5,285,787 A | 2/1994 | Machida .................. 128/653.2 |
| 5,365,927 A | 11/1994 | Roemer et al. ........... 128/653.2 |
| 5,644,234 A | 7/1997 | Rasche et al. ............... 324/318 |
| 6,016,439 A | * 9/2000 | Acker |
| 6,122,541 A | * 9/2000 | Cosman et al. |

FOREIGN PATENT DOCUMENTS

| DE | OS 44 40 225 | 3/1996 |
| DE | OS 198 05 112 | 10/1998 |

OTHER PUBLICATIONS

"Active MR tracking Using an External Tracking Coil at 0.2T for Scan Planer Registration During Kinematic Imaging of Moving Joint," Ma et al., Conference Volume of the International Society of Magnetic Resonance in Medicine, 1998, Sydney, Australia.

* cited by examiner

Primary Examiner—Marvin M. Lateef
Assistant Examiner—Runa Shah Qaderi
(74) Attorney, Agent, or Firm—Schiff Hardin & Waite

(57) ABSTRACT

In a system and method for the registration of images of a subject using magnetic resonance, the positions of one or more markings arranged at the subject and movable together therewith are detected with an acquisition system operated independently of and in parallel with the diagnostic image generating and registration operation of the magnetic resonance system. These positions serve as a criterion for identifying the orientation of the subject relative to the diagnostic imaging system, and the tomogram plane of interest is re-adjusted dependent on the positions of the markings.

30 Claims, 1 Drawing Sheet

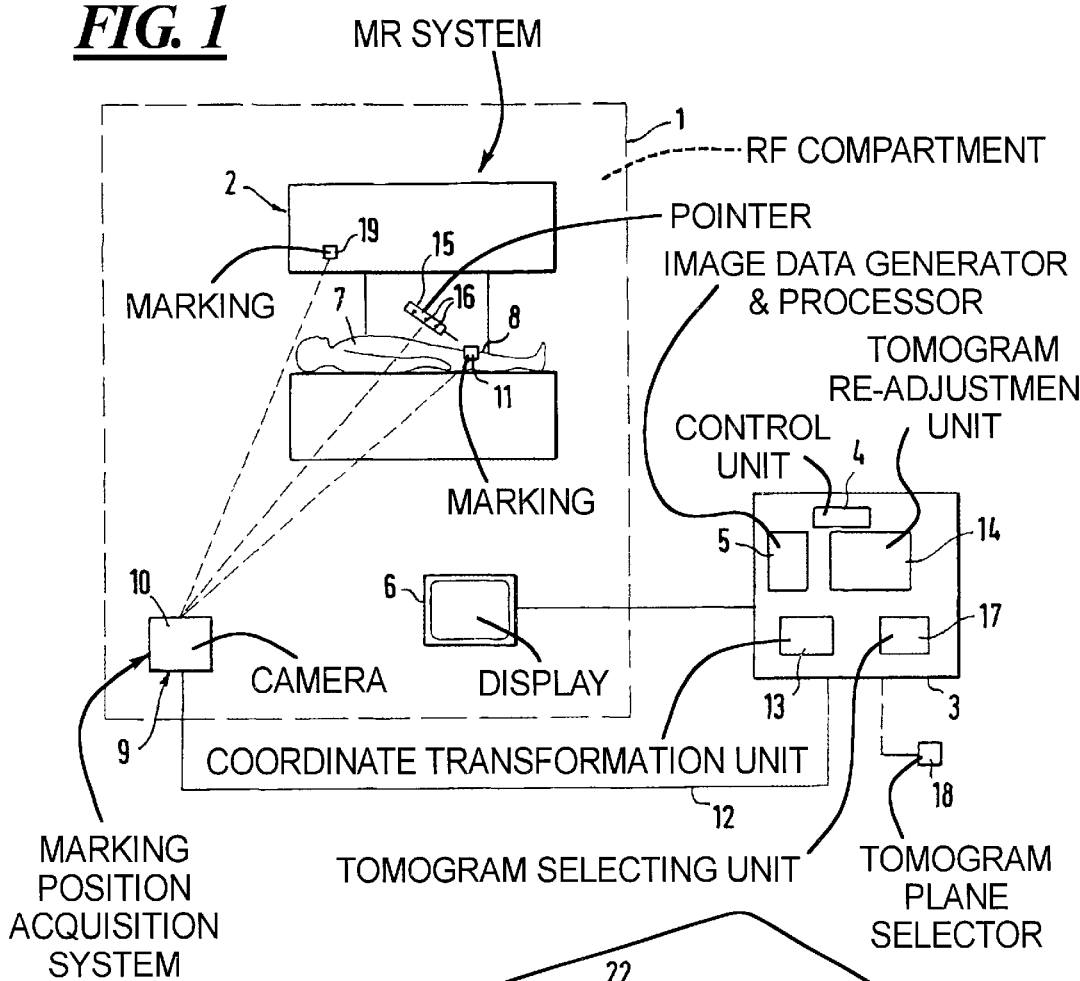
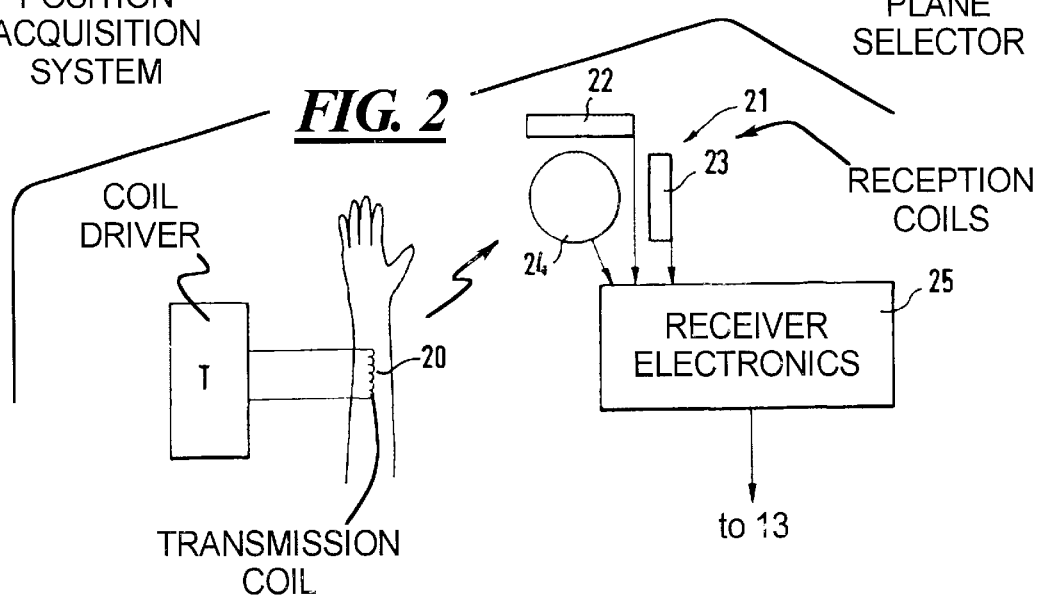

METHOD FOR REGISTERING IMAGES OF A SUBJECT WITH A MAGNETIC RESONANCE SYSTEM AND MAGNETIC RESONANCE SYSTEM FOR THE IMPLEMENTATION OF THE METHOD

BACKGROUND OF THE INVENTION

1. Field of the Invention

The present invention is directed to a method and system for registering images of a subject using magnetic resonance.

2. Description of the Prior Art

The use of magnetic resonance systems, with which images of different sectional planes of the body can be selectively made, is a routine application for diagnosing illnesses. Particularly when examining a body joint, it is often necessary to show the joint in its various angular positions. It is usually desirable that the desired tomogram plane, i.e. the image plane that "is placed through the joint", always remains in the image in order to obtain reproducible images for different joint positions that can be compared to one another. There is, however, always the possibility that, due to the joint movement, the anatomical fixed points that originally were in the tomogram plane will migrate out of it, due to the anatomy of the joint and the range of motion associated therewith. Normally, the operator must manually readjust the measured slice in an image referred to as a "scout", which is measured after every attitudinal change of the subject, wherein three orthogonal slices are registered in rapid succession, after which the corrected slice of interest is redefined on the basis of corresponding operating aids.

Further, the publication "Active MR Tracking Using an External Tracking Coil at 0.2 T for Scan Plane Registration During Kinematic Imaging of Moving Joint" by X. Ma et al. (published in the conference volume of the ISMRM (International Society of Magnetic Resonance in Medicine), 1998, in Sydney, Australia) discloses re-adjustment of the tomogram plane of interest using a marker located at the body that defines this tomogram plane of interest. In this method, a coil provided with the element gadolinium —detectable with magnetic resonance—in a 1% solution was attached to the knee joint. The positional change of this coil due to movement of the knee joint was tracked with magnetic resonance, i.e. the magnetic resonance system provided for generating and registering diagnostic images is likewise employed here for tracking the movement of the coil. The procedure is such that, in alternation, the actual medical image is registered, the detection of the coil subsequently ensues, whereupon the actual image is registered again. An alternating mode is thus compulsory. This results in the imaging sequence necessarily being relatively slow, since the acquisition of the coil must repeatedly ensue in addition to the actual image registration. During this time, an image registration is not possible. In addition, a complicated control of the magnetic resonance registration system is required, since a switch must be continuously made between the different registration modes. In summary, even though a re-adjustment of the tomogram plane can be achieved with this method, it only allows low image registration speeds; and the required control and processing outlay is significant.

SUMMARY OF THE INVENTION

An object of the present invention is to provide a magnetic resonance imaging and system that enables a scan plane re-adjustment with a simultaneously high image registration rate in a simple way.

This object is inventively achieved in a method wherein the positions or one or more markings arranged at the subject and movable together therewith are detected with an acquisition system operated independently of and in parallel with the diagnostic image generating and registration mode of the magnetic resonance system, these positions serving as a criterion for the orientation of the subject relative to the diagnostic imaging system, and wherein, given a movement of the subject detected in this manner, the tomogram plane is re-adjusted dependent on the "new" position of the marking or markings.

In the inventive method, the markings serving as points of reference with respect to which the orientation of the subject relative to the diagnostic imaging system is determined, and the markings are identified with the acquisition system that operates independently of the magnetic resonance system. Optical or electromagnetic acquisition systems are suitable for this purpose. This marking acquisition independently of the operation of the magnetic resonance system allows a continuous image generating and registration mode, since a changeover no longer has to be made in alternation between diagnostic image generation and mark acquisition, as is the case in known systems. At least one marking, and usually three markings, is/are located at the body in a fixed spatial attitudinal relationship relative to one another and move with the subject, The acquired position(s) of the marking(s) thus also move(s) as the subject moves, so that a change in the orientation thereof is acquired and, at the same time, the required change in the position of the tomogram plane can be determined therefrom, so that this plane can be re-adjusted dependent on the position(s) of the marking(s).

The position of one marking, or the positions of several markings fixed in position relative to one another, for example, in a small frame or a corresponding mount, are detected with the acquisition system in a first coordinate system. The position data of the marking(s) are transformed into a second coordinate system, in which the diagnostic imaging system generates the image data, using a transformation matrix that is computationally determined, with the follow-up adjustment of the tomogram plane ensuing in the second coordinate system. Using an adequately fast computer for determining the position data, the transformation matrix, the implementation of the transformation as well as the follow-up plane adjustments, a fast follow-up can be achieved without difficulty, which enables a continuous image registration. The transformation matrix is the link between the first, subject-related coordinate system and the second, system-related coordinate system. Via the transformation matrix, for example, the position and direction of the first coordinate system relative to the second coordinate system is known. When marking positions are acquired in the first coordinate system, these can be transformed without further difficulty into the second coordinate system with the assistance of the transformation matrix. Positional changes of the markings in the first coordinate system can be acquired relative to the second coordinate system, so that the plane re-adjustment can ensue dependent on the positional change.

For determining the desired tomogram plane, at least one further marking can be employed in accordance with the invention, the position thereof being acquired with the acquisition means and the scan plane proceeding therethrough. In this case, for example, the physician thus places this at least one further marking and thus defines a position that can be acquired and transformed by the acquisition system and through which the scan plane is then placed. The acquisition likewise ensues in the first coordinate system. In combination with the position data of the further marking, the position of the tomogram plane to be re-adjusted can be determined from a change in the position of the markings on the subject. Only one further marking can be employed, with respect to which a positionally fixed tomogram plane is defined, particularly a sagittal, dorsal or coronal scan plane. Thus, a stationary tomogram plane is placed through the single position prescribed by the further marking, with a plane selection from a number of possibilities ensuing as warranted. In order to have full freedom in terms of the plane position, three such further markings can be inventively provided through which the tomogram plane is placed. In this case, the position data of the three further markings, that define an entire plane in spatial position are acquired. A limitation to permanently prescribed, for example sagittal, transverse or coronal scan planes is no longer present in this case. Since, in the framework of the examination or treatment, it is often necessary for the physician that to define or modify the desired plane to be observed only during the actual examination, a manual pointer instrument, particularly in the form of a pen, can be employed, which the physician manually positions relative to the subject under examination, i.e., for example, the joint, and that is provided with (carries) the marking or the further markings. This instrument thus is used to position the further markings, at least until they are acquired by the acquisition system. Once the desired plane has been defined, it can be re-adjusted without further steps, so that the pointer instrument no longer has to remain in the designated position.

Alternatively to employing, further markings for determining the tomogram plane in terms of its position, the desired tomogram plane can also be manually defined, particularly using a keyboard or the like. In this case, for example using the computer keyboard or a track ball or the like, a specific plane is defined in the first coordinate system, this then being re-adjusted dependent on the acquired marking positions, as described above.

As mentioned, an optical acquisition system or an electromagnetic acquisition system can be employed as the acquisition system, with correspondingly fashioned markings. A stereoscopic camera is suitable as an optical acquisition system; reflective elements, for example in the form of small balls, that always reflect regardless of their position can be employed in this case as markings, and (if used) as further markings. In the electromagnetic embodiment, a transmission coil preferably operated with alternating voltage can be provided as a marking, and (if used) as further markings, and three reception coils aligned in different spatial directions and fixed in position relative to one another can be provided as an electromagnetic acquisition system. Such alternating current operation of the induction coils is unproblematical insofar as the fields thereby generated do not influence the fields employed in the framework of the diagnostic magnetic resonance examination. The positions of the marking can be continuously or discontinuously acquired.

In addition to the aforementioned method, the invention is directed to a magnetic resonance system for the implementation of the method, having an acquisition system operable independently of and in parallel with the diagnostic image generating and registration mode of the system for acquiring the position data for one or more markings attachable to the subject which are movable together therewith, the position data serving as a criterion for the orientation of the subject relative to the diagnostic imaging system and, thus an indicator for the movement of the subject. The position data are identified in a first coordinate system, having means for the transforming of the position data into a second coordinate system in which the image data are generated by the diagnostic system, and having means for automatic re-adjustment of a tomogram plane dependent on the identified position data.

Further, the inventive system also can include means for defining to tomogram plane, at least one further marking whose position can be acquired with the acquisition system in the first coordinate system and through which the scan plane proceeds being allocated thereto. This means for defining the tomogram plane can be a suitable computer that is capable of correspondingly defining and re-adjusting the tomogram plane. Only one further marking can be provided, whereby a positionally fixed, predetermined tomogram plane, particularly a sagittal, transverse or coronal tomogram plane, can be defined relative to this marking by the tomogram plane defining means. Alternatively, three further markings can be provided, the tomogram plane defined in terms of the data obtained thereby then being placed therethrough. The one or more markings can be produced using a manual pointer instrument, particularly in the form of a pen that can then be correspondingly positioned by the physician.

Alternatively, the means for defining the tomogram plane can be a device for the manual definition of the tomogram plane in the first coordinate system, particularly in the form of a keyboard or the like such as a track ball, joystick or some other suitable device. An optical acquisition system can be used, particularly in the form of a stereoscopic camera with allocated, reflective markings. Another alternative is an electromagnetic acquisition system having three reception coils fixed in position relative to one another and aligned in orthogonal spatial directions. A transmission coil is then utilized as the marking, or further marking. Regardless of the type of acquisition system which is used, a continuous or discontinuous acquisition is possible therewith.

DESCRIPTION OF THE DRAWINGS

FIG. 1 is a schematic illustration of a first embodiment of an inventive magnetic resonance system.

FIG. 2 is a schematic illustration of a second embodiment of an inventive magnetic resonance system.

DESCRIPTION OF THE PREFERRED EMBODIMENTS

FIG. 1 shows a magnetic resonance system 2 arranged in a radio-frequency compartment 1 (cabin) and having a control console 3 arranged outside the compartment that controls the complete system operation. The magnetic resonance system 2 in the exemplary embodiment is an open magnet system having two pole shoes (not shown in detail) lying opposite one another that are connected to one another via a C-shaped magnetic return. A magnetic drive is composed of respective electromagnet windings arranged at the pole shoes, the magnet system generating a uniform and vertically aligned basic magnetic field between the pole shoes in approximately spherical region. Further, gradient coils for generating gradient fields in three directions residing perpendicular to one another as well as radio-frequency antennas for exciting or receiving the magnetic resonance signals are used in the schematically illustrated system of FIG. 1 but are not shown. The advantage of the open magnet system is comprised therein that it offers a physician or examining person lateral access in addition to the patient access in order to be able to undertake manipulations at the patient. The system 2 is shown only schematically in FIG. 1; the individual elements which are not relevant to the invention are not shown in detail.

The control console 3 provided for the operation of the system includes a control unit 4 that, for example, contains an appropriate control computer which generates the control signals required for the system operation and receives magnetic resonance signals from the radio-frequency antennas and forwards them to an image data generator and processor 5. Further, a gradient amplifier and a radio-frequency transmission-reception system are provided. The generated image data are displayed at a monitor 6 that is arranged in the radio-frequency compartment 1, making it possible for the physician to immediately view the registered images.

When, for example, the knee joint 8 of the patient 7 (the subject) arranged on the patient table of the magnetic resonance system 2 is to be examined, it is often necessary to image this knee joint 8 in different positions. Usually accompanying the movement of the knee is a displacement of the anatomical fixed points actually of interest out of the tomogram plane, i.e. out of the previously set plane with respect to the patient 7 in which the examination image is registered. This means that, without an adjustment of the tomogram plane position, a registration of the image after the movement of the knee joint 8 would image a different body plane than in the preceding registration, so that no comparable images would be produced.

In order to alleviate this situation, the inventive magnetic resonance system offers the possibility of tomogram plane re-adjustment. To this end, an acquisition system 9 in the form (in this embodiment) of a stereoscopic camera 10 is arranged within the radio-frequency compartment 1. This camera 10 has a field of view encompassing a marking element 11 that is arranged at the patient 7 in the region of the knee joint 8. This marking element 11 is composed of three separate markings fixedly arranged with respect to one another and orthogonally aligned relative to one another that are reflectively fashioned and thus can be acquired by the camera 10. For example, reflective balls can be employed, these always being capable of being acquired regardless of the arrangement of the marking element 11, due to their spherical surface. The fixed markings are acquired by the camera 10 in a first coordinate system and their position data are determined in this coordinate system. The acquisition system 9 is connected to the control console 3 via a data line 12. The control console 3 contains a coordinate transformation unit 13 for transforming the position data of the markings registered in the first coordinate system into a second coordinate system of the magnetic resonance system 2 in which the image data are registered and defined. This occurs computationally with determination of a transformation matrix. As a result, it is possible to transfer the position data into the second coordinate system. The movement of the patient relative to the second coordinate system thus can be identified.

When the relative movement of the patient is known, the re-adjustment unit 14 provided in the control console 3 for re-adjustment of the previously defined tomogram plane can correspondingly re-adjust this plane such that it again lies relative to the anatomical fixed points with respect to the knee joint 8 as it did in the preceding joint position. This means that after a corresponding re-adjustment of the tomogram plane, the same body plane portion is registered as given the preceding joint position. Comparable images can be obtained as a result.

In order to define the tomogram plane of interest with respect to the knee joint 8, a pointer instrument 15 can be provided which is manually moved by the physician, for example in the form of a pen. Three further markings 16 are attached thereto in the illustrated example. As shown by the dashed lines in FIG. 1, these markings are likewise identified by the acquisition system 9, and the identified position data in the first coordinate system are forwarded to the control console 3. The control console 3 has a tomogram selecting unit 17 for defining the tomogram plane thereby identified, whereby the definition likewise ensuing based on the transformation matrix determined by the unit 13. It is thus possible for the physician to define or correct an arbitrary tomogram plane during the treatment, and this arbitrary tomogram plane can be re-adjusted in the same way.

A corresponding tomogram plane that can lie arbitrarily relative to the second coordinate system of the magnetic resonance system, is independently deferred with the three markings 16 provided at the pointer instrument 15. However, it is equally possible to provide only one further marking 16 that defines the basic position of the tomogram plane. The definition of the respective images of the tomogram plane can ensue with the unit 17 so that a permanently set, for example a sagittal, tomogram plane is placed through this marking position 16. The unit 17 can thereby also be used to make a selection from among different, permanently set tomogram planes, which are then occupied by the marking position.

Alternatively or additionally, a manual tomogram plane selector 18 for the manual definition of the desired tomogram plane can be allocated to the unit 17, for example in the form of a keyboard or the like. By entering corresponding position data, it is thus possible to define the desired tomogram plane in the first coordinate system, which is then being correspondingly re-adjusted. The selector 18 shown outside the radio-frequency compartment in FIG. 1 can, of course, also be arranged in the radio-frequency compartment. A further fixedly attached marking 19 whose position can be detected by the acquisition system 9 is provided at the magnetic resonance system. This makes it possible to take any displacements of the acquisition system 9 into consideration, since the relative position of the camera 10 with respect to the system 2 can be identified by detecting the marking 19.

FIG. 2 shows a schematic diagram of an electromagnetic position acquisition system that can be utilized instead of the optical acquisition system described in FIG. 1. In the illustrated example, this electromagnetic acquisition system includes a marking attached to the hand of the patient in the form of a transmission coil 20 that can be operated with d.c. or a.c. voltage via a driver T. Operation thereof using an alternating voltage operation is expedient for application in a magnetic resonance system. The transmission coil 20 generates an electromagnetic dipole field whose alignment is dependent on the orientation of the coil, and thus of the patient's hand. This transmission coil 20 has an electromagnetic acquisition unit 21 composed of three reception coils 22, 23, 24 allocated to it, these being fixed in position relative to one another and being respectively aligned in different orthogonal spatial directions, thereby defining a coordinate system. These reception coils, usually arranged at a distance of approximately 50 cm from the transmission coil 20, respectively receive signals representing the vector (direction and magnitude along the coil axis) of the field generated by the transmission coil 20 in the coil direction, which are supplied to the following receiver electronics 25. The output signal from the receiver electronics, which thus indicates the position and orientation of the transmission coil 20, is communicated to the unit 13 of the control console 3 of the magnetic resonance system, an automatic re-adjustment of the tomogram plane of interest proceeds as described above.

The determination of the tomogram plane with the further marking ensues in the same way. A transmission coil (not shown) is also employed for this purpose, which is, for example, arranged in the region of a pen held by the physician and which is brought into the desired position relative to the patient, this position being registered by the electromagnetic acquisition system 21 and communicated to the controller.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for registering images of a subject by magnetic resonance, comprising the steps of:

arranging at least one marking at a subject so as to be movable together with said subject;

obtaining plurality of a diagnostic tomograms of said subject while said subject is moving, using a magnetic resonance imaging system, said tomograms including a first tomogram in a tomogram plane and at least one successive tomogram;

identifying a position of said marking with a marking position acquisition system operated independent of and in parallel with said magnetic resonance imaging system;

continuously identifying an orientation of said subject relative to said magnetic resonance imaging system while said subject is moving from the position of said marking obtained with said marking position acquisition system; and re-adjusting said tomogram plane in said magnetic resonance imaging system for said at least one successive tomogram dependent on the position of the marking so that all of said plurality of tomograms are in said tomogram plane.

2. A method as claimed in claim 1 comprising:

acquiring the position of the marking with said marking position acquisition system in a first coordinate system;

obtaining image data from said tomogram in a second coordinate system; and transforming the position of said marking in said first coordinate system into a position of said marking in said second coordinate system and re-adjusting said tomogram plane in said second coordinate system.

3. A method as claimed in claim 1 comprising the additional steps of providing a further marking at said subject which moves together with said subject and acquiring the position of said further marking with said marking position acquisition system, said magnetic resonance system having a scan plane proceeding through said further marking, and re-adjusting said tomogram plane dependent on the position of said marking and on the position of said further marking.

4. A method as claimed in claim 3 comprising defining said further marking with a manually positionable pen, which identifies a position detectable in said marking position acquisition system.

5. A method as claimed in claim 3 comprising employing a single further marking and defining a positionally prescribed tomogram plane with respect to said single further marking, said positionally prescribed tomogram plane being selected from the group of planes comprising a sagittal plane, a transverse plane and a coronal plane.

6. A method as claimed in claim 3 comprising employing three further markings through which said tomogram plane proceeds.

7. A method as claimed in claim 6 comprising the step of defining said three further markings using a manually positionable pen which defines a location detectable with said marking position acquisition system.

8. A method as claimed in claim 1 comprising defining a selected tomogram plane manually using a user interface of said magnetic resonance system.

9. A method as claimed in claim 1 comprising employing an optical image acquisition system as said marking position acquisition system and employing an optically detectable marking as said marking.

10. A method as claimed in claim 9 comprising employing a stereoscopic camera as said optical acquisition system, and employing, as said optically detectable marking, three optically detectable markers which are fixed in position relative to each other.

11. A method as claimed in claim 1 comprising employing an electromagnetic image acquisition system as said marking position acquisition system and employing an electromagnetically detectable marker as said marking.

12. A method as claimed in claim 11 comprising employing a transmission coil as said electromagnetically detectable marker, and providing three reception coils aligned in respectively different spatial directions and fixed in position relative to each other as said electromagnetic acquisition system.

13. A method as claimed in claim 12 comprising the additional step of supplying said transmission coil with alternating voltage.

14. A method as claimed in claim 1 wherein the step of acquiring the position of said marking with said marking position acquisition system comprises continuously acquiring the position of said marking.

15. A method as claimed in claim 1 wherein the step of acquiring the position of said marking with said marking position acquisition system comprises discontinuously acquiring the position of said marking.

16. A method as claimed in claim 1 comprising employing an optical image acquisition system as said marking position acquisition system and employing an optically detectable marker as said marker.

17. An apparatus as claimed in claim 16 wherein said optical acquisition system includes a stereoscopic camera and wherein said marking comprises three optically detectable markers which are fixed in position relative to each other.

18. An apparatus for registering images of a subject by magnetic resonance, comprising the steps of:

at least one marking arranged at a subject so as to be movable together with said subject;

a magnetic resonance imaging system for obtaining a plurality of diagnostic tomograms of said subject while said subject is moving, said tomograms including a first tomogram in a tomogram plane and at least one successive tomogram;

a marking position acquisition system for identifying a position of said marking operated independent of and in parallel with said magnetic resonance imaging system;

means for continuously identifying an orientation of said subject relative to said magnetic resonance imaging system while said subject is moving from the position of said marking obtained with said marking position acquisition system; and means for re-adjusting tomogram plane in said magnetic resonance imaging system for said at least one successive tomogram dependent on the position of the marking so that all of said plurality of tomograms are in said tomogram plane.

19. An apparatus as claimed in claim 18 wherein said marking position acquisition system acquires the position of the marking with said marking position acquisition system in a first coordinate system wherein said magnetic resonance imaging system produces said tomogram in a second coordinate system, and further comprising means for transforming the position of said marking in said first coordinate system into a position of said marking in said second coordinate system, wherein said means for re-adjusting and re-adjusts said tomogram plane in said second coordinate system.

20. An apparatus as claimed in claim 18 comprising a further marking at said subject which moves together with said subject, said marking position acquisition system acquiring the position of said further marking, said magnetic resonance system having a scan plane proceeding through said further marking, and wherein said means for re-adjusting re-adjusts said tomogram plane dependent on the position of said marking and on the position of said further marking.

21. An apparatus as claimed in claim 20 comprising a manually positionable pen which identifies a position of said further marking detectable in said marking position acquisition system.

22. An apparatus as claimed in claim 20 comprising a single further marking and means for defining a positionally prescribed tomogram plane with respect to said single further marking, said positionally prescribed tomogram plane being selected from the group of planes comprising a sagittal plane, a transverse plane and a coronal plane.

23. An apparatus as claimed in claim 20 comprising employing three further markings through which said tomogram plane proceeds.

24. An apparatus as claimed in claim 23 comprising a manually positionable pen which defines respective locations of said three further markings which are detectable with said marking position acquisition system.

25. An apparatus as claimed in claim 18 comprising a user interface of said magnetic resonance system defining a select tomogram plane manually.

26. An apparatus as claimed in claim 18 wherein said marking position acquisition system comprises an electromagnetic image acquisition system and wherein said marking comprises an electromagnetically detectable marker.

27. An apparatus as claimed in claim 26 wherein said electromagnetically detectable marker comprises a transmission coil, and wherein said electromagnetic acquisition system comprises three reception coils aligned in respectively different spatial directions and fixed in position relative to each other.

28. An apparatus as claimed in claim 27 comprising means for supplying said transmission coil with alternating voltage.

29. An apparatus as claimed in claim 18 wherein said marking position acquisition system continuously acquires the position of said marking.

30. An apparatus as claimed in claim 18 wherein said marking position acquisition system discontinuously acquires the position of said marking.

* * * * *